United States Patent
Torihata et al.

[11] Patent Number: 5,988,481
[45] Date of Patent: Nov. 23, 1999

[54] BONDING APPARATUS WITH ADJUSTABLE HEATING BLOCKS, CLAMPS, AND RAILS

[75] Inventors: Minoru Torihata, Musashimurayama; Shinji Maki, Fussa, both of Japan

[73] Assignee: Kabushiki Kaisha Shinkawa, Tokyo, Japan

[21] Appl. No.: 09/013,782

[22] Filed: Jan. 26, 1998

[30] Foreign Application Priority Data

Jan. 24, 1997 [JP] Japan ................................. 9-025802

[51] Int. Cl.⁶ .............................. B23K 1/00; B23K 37/04; B30B 5/02
[52] U.S. Cl. .................. 228/49.5; 228/44.7; 228/6.2; 29/25.01; 156/583.4
[58] Field of Search ........................... 228/4.5, 6.2, 44.7, 228/49.5, 212; 438/111, 112; 29/25.01; 269/60, 309, 289; 156/583.1, 583.4

[56] References Cited

U.S. PATENT DOCUMENTS

| | | |
|---|---|---|
| 4,763,827 | 8/1988 | Watanabe et al. ...................... 228/102 |
| 4,986,460 | 1/1991 | Yamazaki et al. ....................... 228/4.5 |
| 5,082,165 | 1/1992 | Ishizuka . |
| 5,181,646 | 1/1993 | Ushiki et al. .............................. 228/4.5 |
| 5,186,719 | 2/1993 | Egashira et al. ........................ 29/25.01 |
| 5,225,025 | 7/1993 | Lambing et al. ........................ 156/358 |
| 5,372,972 | 12/1994 | Hayashi et al. ............................ 29/827 |
| 5,749,698 | 5/1998 | Miyoshi ................................... 414/800 |

FOREIGN PATENT DOCUMENTS

| | | |
|---|---|---|
| H1-124224 | 5/1989 | Japan . |
| H4-39227 | 6/1992 | Japan . |

*Primary Examiner*—Patrick Ryan
*Assistant Examiner*—Carlos J. Gamino
*Attorney, Agent, or Firm*—Koda & Androlia

[57] ABSTRACT

A bonding apparatus including a pair of guide rails, a main heating block and a pair of pre-stage and after-stage heating blocks so as to heat a lead frame conveyed on the pair of guide rails, and the pre-stage and after-stage heating blocks can be moved in the direction of width of the lead frame together with one of the pair of guide rails and are installed so that they are positioned beneath the other frame guide rail.

3 Claims, 5 Drawing Sheets

BONDING APPARATUS WITH ADJUSTABLE HEATING BLOCKS, CLAMPS, AND RAILS

BACKGROUND OF THE INVENTION

1. Field of the Invention

The present invention relates to a bonding apparatus such as a die bonding apparatus, wire bonding apparatus, etc.

2. Prior Art

A bonding apparatus is equipped with a pair of frame guide rails which are installed so as to face each other and guide lead frames, a heating block which is for a bonding stage and is installed between the frame guide rails so as to heat the lead frames, and feeding claws which intermittently feed the lead frames.

In such a bonding apparatus, the heating block must be able to heat the lead frames to a prescribed temperature in a short time, while at the same time it must be able to prevent abrupt temperature changes of the lead frames. So as to satisfy these requirements, a pre-stage heating block and an after-stage heating block are generally installed before and after the bonding stage heating block or a main heating block.

A conventional example of a bonding apparatus of this type which includes three heating blocks is described in Japanese Pre-Examined Patent Application Publication (Kokai) No. H1-124224.

In this prior art (Japanese H1-124224), the three heating blocks are in fact combined into a single unit. However, in the bonding apparatus with a single unit heating block, the size of the heating block tends to be large, and temperature control is generally difficult. Accordingly, currently, three heating blocks are more often used separately.

In cases where the width of the lead frames changes due to a change in the type of product (lead frames) to be processed, it is necessary to change the width or distance between the pair of frame guide rails so as to meet the width of the new product to be processed. Furthermore, it is also necessary to replace the pre-stage heating block and after-stage heating block and adjust the positions of the feeding claws.

Adjustment of the width or distance between the guide rails is currently accomplished automatically as described in, for example, Japanese Examined Patent Application Publication (Kokoku) No. H4-39227. However, as to the pre-stage heating block and after-stage heating block, it is necessary to loosen the bolts and nuts fastening the heating blocks and then to replace the heating blocks with heating blocks that are suited to the new product to be processed. However, these operations are complex and require a considerable amount of time. Furthermore, it is also necessary to keep pre-stage heating blocks and after-stage heating blocks ready for each type of product to be processed, causing problems in terms of storing and equipment costs.

SUMMARY OF THE INVENTION

Accordingly, the object of the present invention is to provide a bonding apparatus in which the product change-over time can be shortened and thereby improve the operating efficiency of the apparatus.

The object of the present invention is accomplished by a unique structure for a bonding apparatus which includes a pair of frame guide rails that face each other so as to guide a lead frame, and a pre-stage heating block, a bonding-stage heating block and an after-stage heating block for heating the lead frame guided by the frame guide rails, and the apparatus is characterized in that the pre-stage heating block and the after-stage heating block are positionally movable together with one of the frame guide rails in the direction of width of the lead frame and are positioned underneath the other frame guide rail.

The object of the present invention is accomplished by a still another unique structure that includes, in the above-described structure, feeding claws which are provided so as to be movable in the direction of width of the lead frame together with one of the frame guide rails.

DETAILED DESCRIPTION OF THE INVENTION

One embodiment of the present invention will be described with reference to FIGS. 1 through 5.

Figure 2:
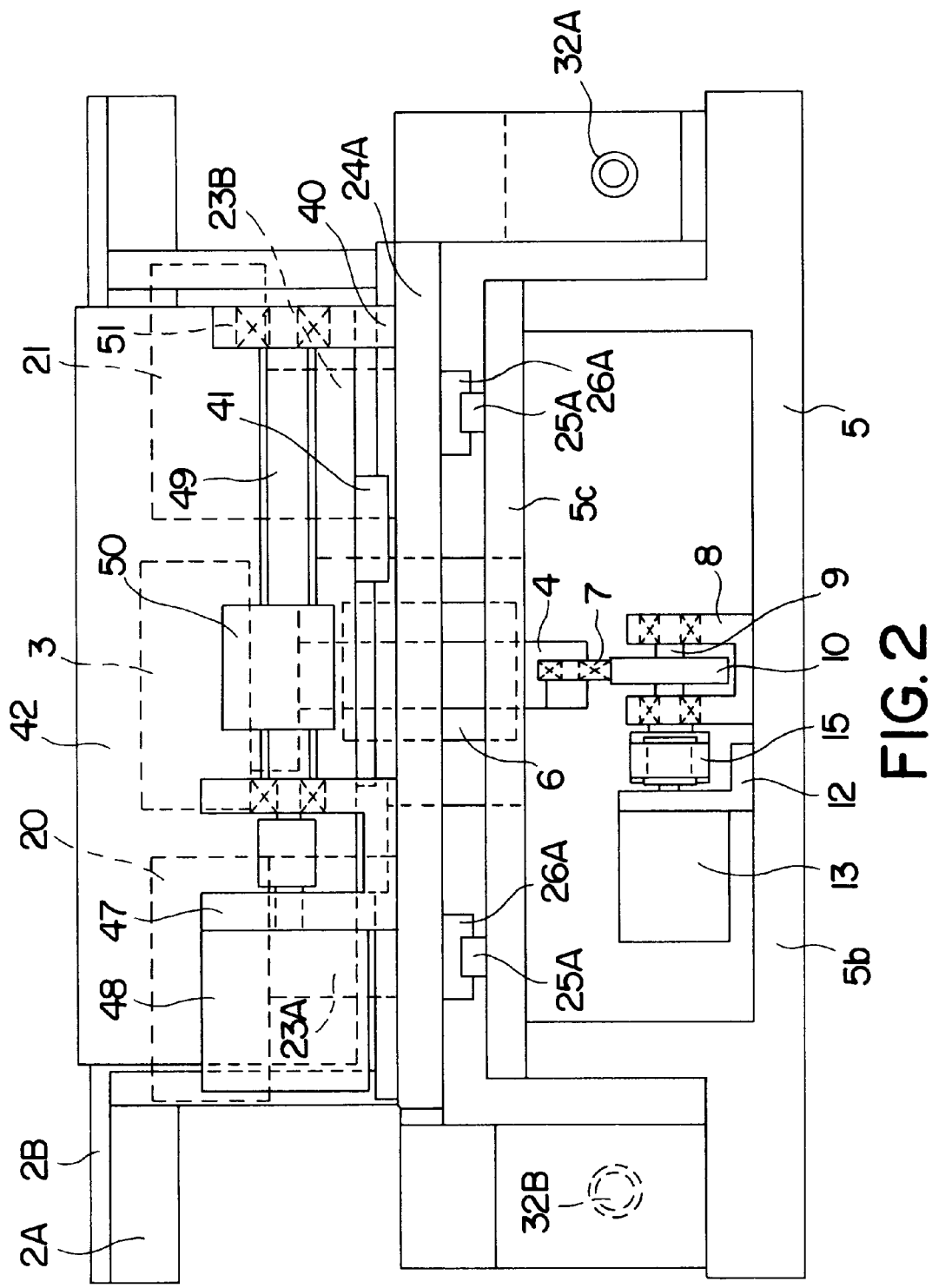
FIG. 2 is a front view of FIG. 1.
Figure 3:
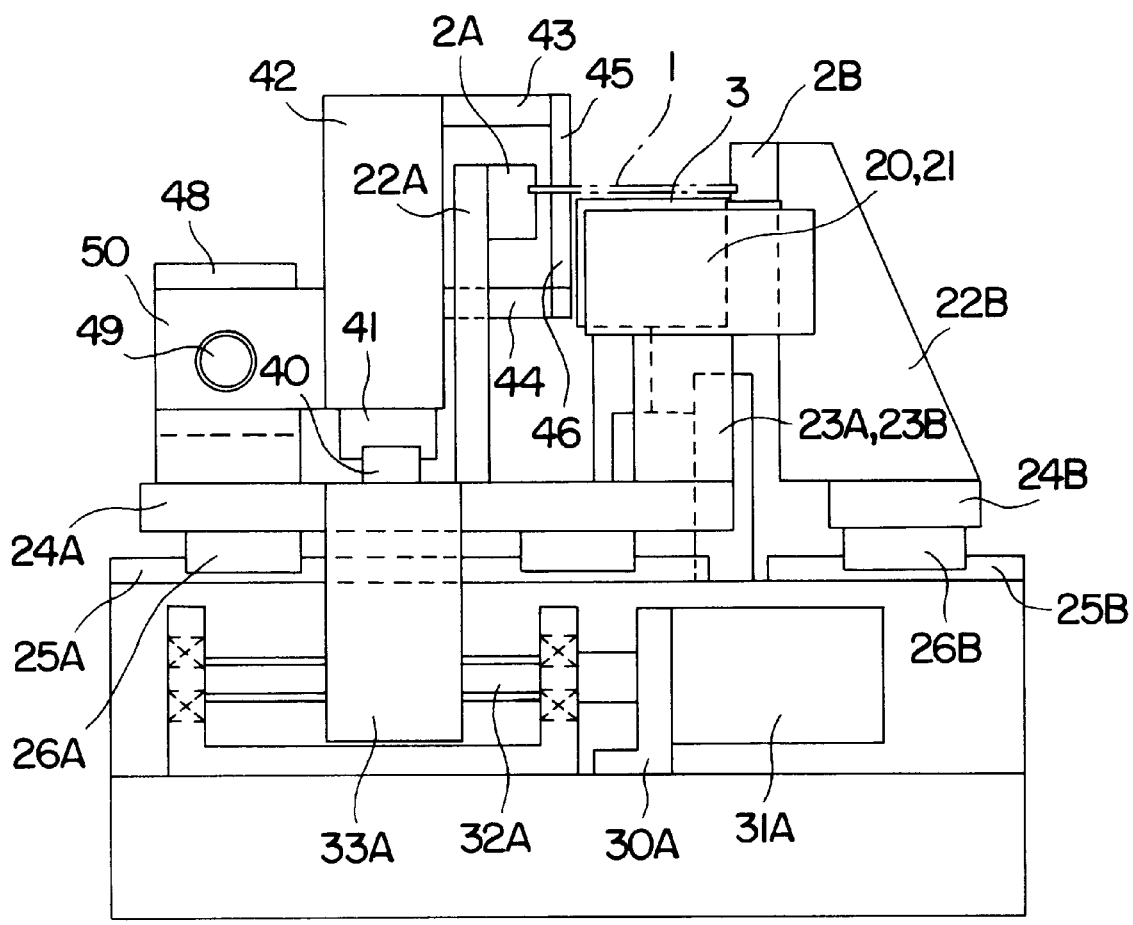
FIG. 3 is a right-side view of FIG. 1.

A bonding stage heating block or main heating block 3 is provided between a pair of frame guide rails 2A and 2B which are installed in parallel so as to face each other and to guide a lead frame 1 (see FIG. 3). The heating block 3 is positioned between the guide rails 2A and 2B and, as best seen from FIGS. 2 and 3, is located beneath these rails 2A and 2B. This bonding stage heating block 3 has, as seen from FIG. 2, a slider 4 which extends downward.

The slider 4 is installed so as to be moved upward and downward along a linear guide 6 which is fastened to the upright portion 5a of a stand 5. Furthermore, a roller 7 is rotatably mounted on the lower end of the slider 4.

A bearing holder 8 is provided on the bottom plate 5b of the stand 5, and a cam shaft 9 is supported in this bearing holder 8 in a rotatable fashion. A cam 10 is fastened to the cam shaft 9 so as to face the roller 7, and a pulley 11 (see FIG. 4) is fastened to the end of the cam shaft 9. Furthermore, a heating block raising-and-lowering motor 13 is provided on the bottom plate 5b of the stand 5 via a motor attachment fitting 12, and a belt 15 is provided between the pulley 11 of the cam shaft 9 and a pulley 14 fastened to the output shaft of the heating block raising-and-lowering motor 13.

Figure 5:
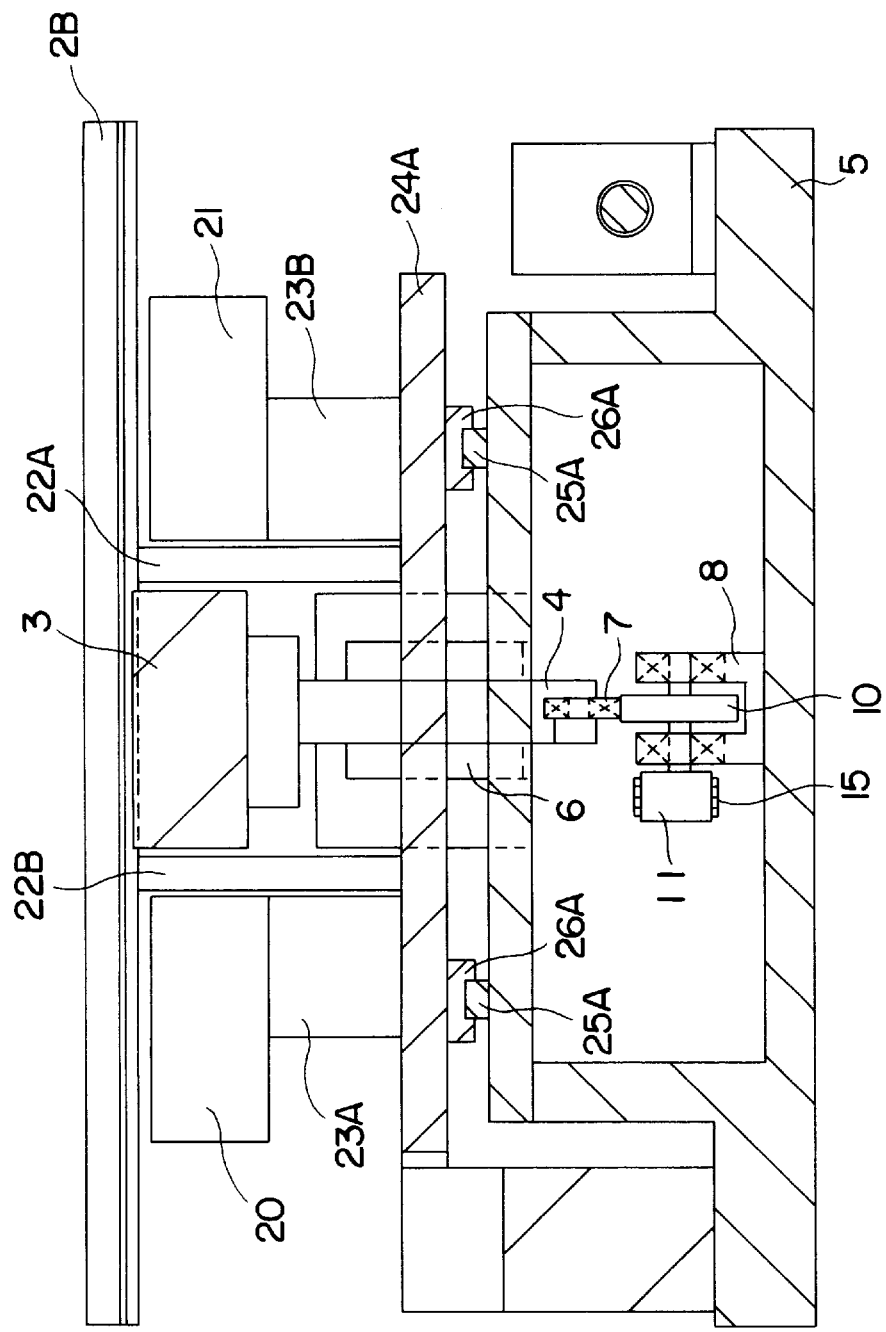
FIG. 5 is a sectional view taken along the line 5—5 in FIG. 1.

Furthermore, as best seen from FIGS. 2 and 5, a pre-stage heating block 20 and an after-stage heating block 21 are provided beneath the frame guide rails 2A and 2B. These supplemental heating blocks 20 and 21 are located on either side of the bonding stage heating block 3.

As seen from FIG. 1, the pre-stage heating block 20 and after-stage heating block 21 are respectively of such a size that these heating blocks 20 and 21 extend beneath the frame guide rail 2B (the frame guide rail 2B facing the frame guide rail 2A on which the upper claw 45 and lower claw 46 (described later) are installed). In other words, a part of each one of the blocks 20 and 21 is located beneath the guide rail 2B.

Figure 4:
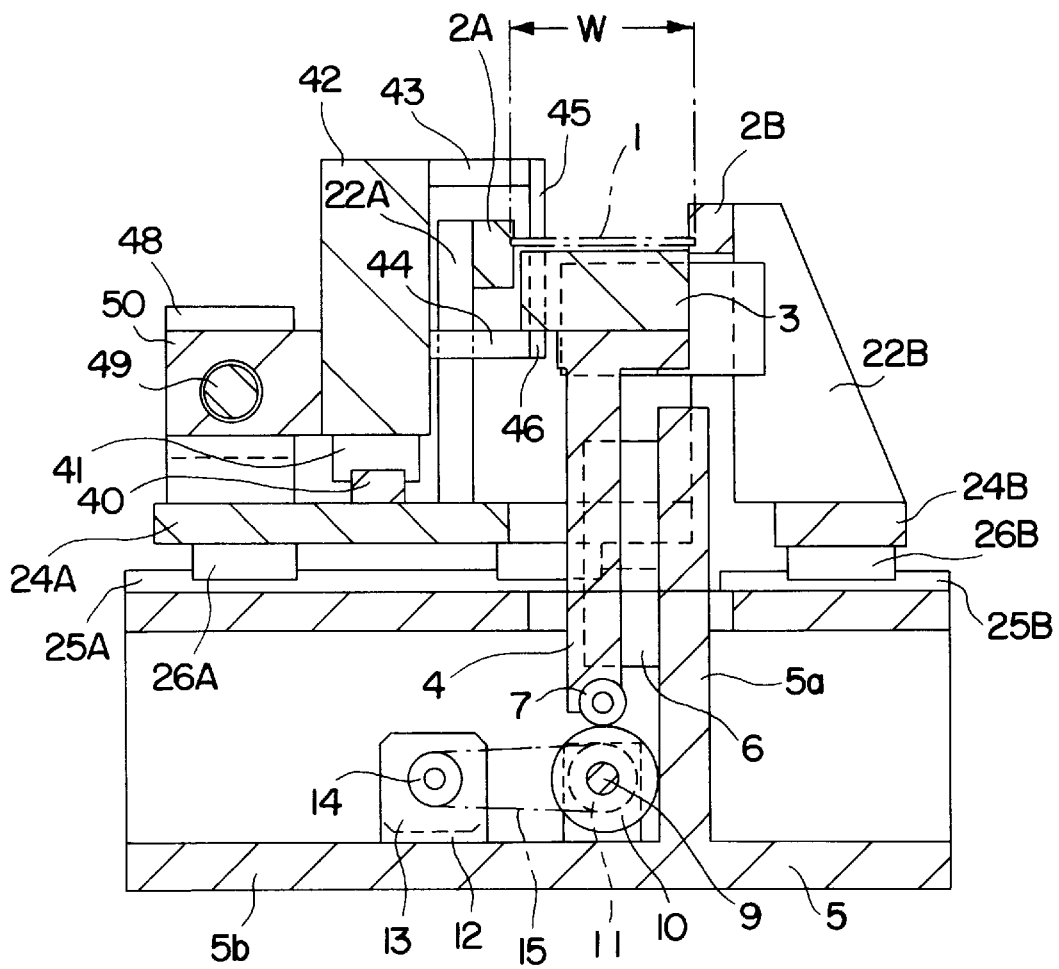
FIG. 4 is a sectional view taken along the line 4—4 in FIG. 1.

The frame guide rail 2A and the pre-stage and after-stage heating blocks 20 and 21 are respectively provided on a moving plate 24A via a rail supporting plate 22A and via heating block supporting plates 23A and 23B. On the other hand, the frame guide rail 2B is, as best seen from FIG. 4, provided on a moving plate 24B via a rail supporting plate 22B.

Figure 1:
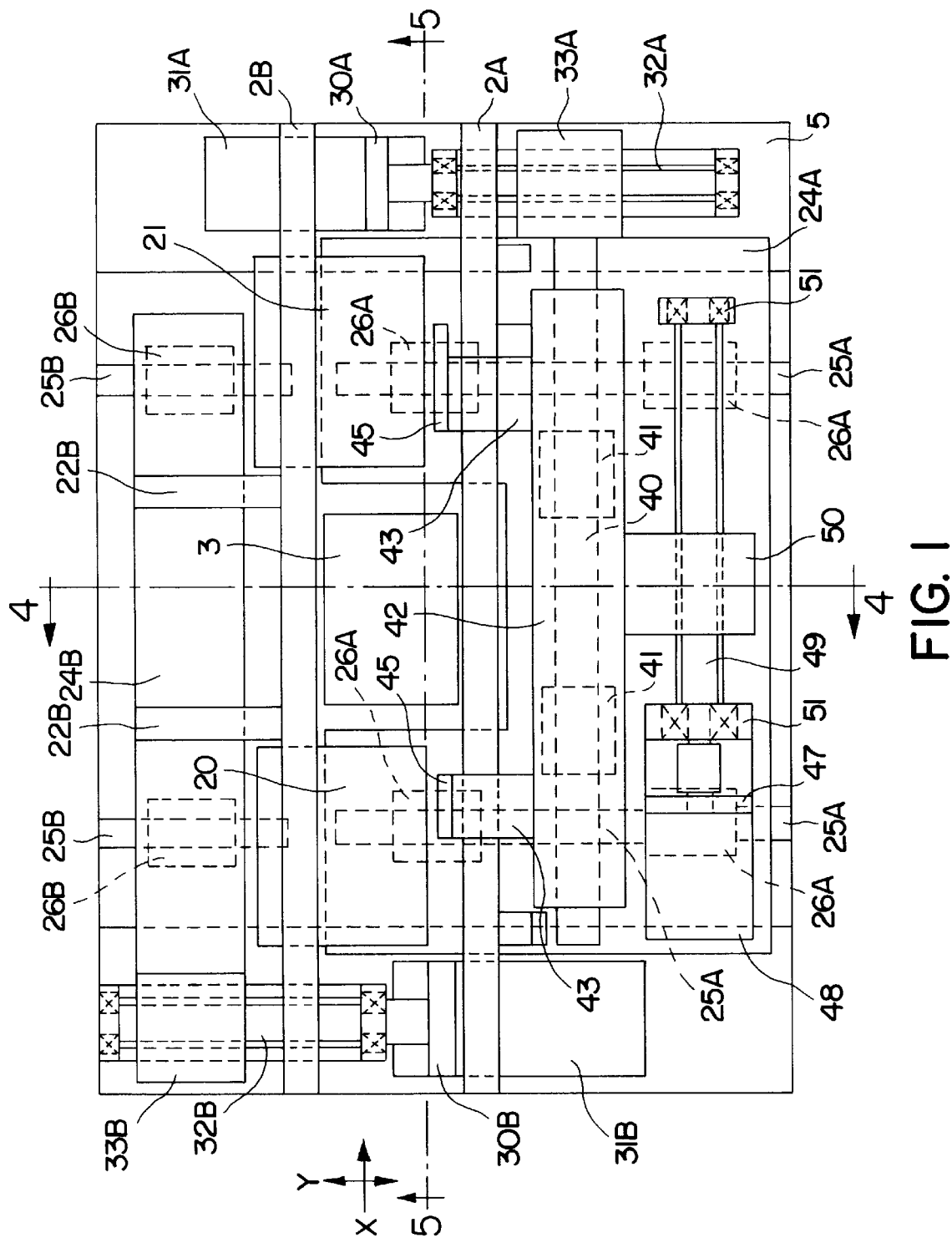
FIG. 1 is a plan view of one embodiment of the bonding apparatus of the present invention.

Meanwhile, two linear guides 25A and 25B which extend, as seen from FIG. 1, in the direction perpendicular to the conveying direction of the lead frames 1 (i.e., the conveying direction being parallel to the frame guide rails 2A and 2B) are respectively provided on the top plate 5c (see FIG. 2) of the stand 5 so that the guides 25A and 25B face the undersurfaces of the moving plates 24A and 24B.

In the following description, as shown in FIG. 1, the conveying direction of the lead frame 1 will be referred to as the X direction, and the direction perpendicular to this X direction will be referred to as the Y direction.

Furthermore, sliders 26A and 26B are respectively installed on the linear guides 25A and 25B in a slidable fashion. As seen from FIGS. 3 and 4, these sliders 26A and 26B are respectively fastened to the undersurfaces of the moving plates 24A and 24B.

A rail width adjustment motor 31A is provided on the right-side portion in FIG. 1 of the stand 5 via a motor supporting plate 30A, and an externally-threaded screw shaft 32A which is disposed in the Y direction is fastened to the output shaft of the rail width adjustment motor 31A. An internally-threaded screw 33A is screw-engaged with the externally-threaded screw shaft 32A and is fastened to the right-side surface in FIG. 1 of the moving plate 24A.

Likewise, another rail width adjustment motor 31B is provided on the left-side portion in FIG. 1 of the stand 5 via a motor supporting plate 30B, and an externally-threaded screw shaft 32B which is disposed in the Y direction is fastened to the output shaft of the rail width adjustment motor 31B. An internally-threaded screw 33B is screw-engaged with the externally-threaded screw shaft 32B and is fastened to the left-side surface in FIG. 1 of the moving plate 24B.

Furthermore, as seen from FIGS. 3 and 4, a linear guide 40 is provided on the moving plate 24A so as to extend in the X direction (see FIG. 1). Sliders 41 are installed on the linear guide 40, and a claw opening-and-closing mechanism 42 of a universally known structure is provided on the sliders 41.

The claw opening-and-closing mechanism 42 has an upper claw arm 43 and lower claw arm 44 which can be opened and closed (or moved away from and closer to each other); and an upper claw 45 and a lower claw 46 for chucking the lead frame 1 in between are fastened to the upper claw arm 43 and lower claw arm 44.

A claw feeding motor 48 is fastened via a motor supporting plate 47 to the moving plate 24A so that the motor 48 is located, as seen from FIG. 2, outside the claw opening-and-closing mechanism 42; and an externally-threaded screw shaft 49 which is disposed in the X direction is fastened to the output shaft of this claw feeding motor 48. An internally-threaded screw 50 is screw-engaged with the externally-threaded screw shaft 49 and is fastened to the claw opening-and-closing mechanism 42. The externally-threaded screw shaft 49 is rotatably supported by bearings 51 that are fastened to the moving plate 24A.

Next, the operation of the above embodiment will be described.

First, the adjustment of the guide width or distance between the frame guide rails 2A and 2B will be described. This mechanism for the guide width adjustment itself is universally known as described in the "Prior Art" section of the instant specification.

More specifically, when the rail width adjustment motor 31A is actuated and the externally-threaded screw shaft 32A is rotated, the internally-threaded screw 33A and the moving plate 24A are moved in the Y direction. As a result, the frame guide rail 2A is also moved in the Y direction together with the moving plate 24A. Likewise, when the width adjustment motor 31B is actuated and the externally-threaded screw shaft 32B is rotated, the internally-threaded screw 33B and the moving plate 24B are moved in the Y direction. As a result, the frame guide rail 2B is also moved in the Y direction together with the moving plate 24B.

Thus, the guide width or distance between the frame guide rails 2A and 2B can be adjusted as desired. Accordingly, in cases where the width of the lead frames changes as a result of a change in the type of product (lead frame) to be processed, the width or distance between the frame guide rails 2A and 2B is adjusted in the direction of width W of the lead frame 1 (see FIG. 4) to be processed by driving the rail width adjustment motors 31A and 31B so that the guide width meets the width of the lead frame to be processed.

Next, the feeding of the lead frame 1 will be described.

The lead frame feeding mechanism itself is also universally known. In other words, the claw opening-and-closing mechanism 42 is actuated so as to close the upper and lower claws 45 and 46 (via the upper and lower claw arms 43 and 44); as a result, the lead frame 1 is chucked by the claws 45 and 46. Afterward, the claw feeding motor 48 is actuated and the externally-threaded screw shaft 49 is rotated by a fixed amount. As a result, the internally-threaded screw 50 and claw opening-and-closing mechanism 42 are moved in the X direction, and the lead frame 1 is thus fed by a fixed amount.

After this, the claw opening-and-closing mechanism 42 is actuated in the opposite direction from that described above so as to open the upper and lower claws 45 and 46 via the upper and lower claw arms 43 and 44; as a result, the lead frame 1 is released from the claws 45 and 46. Then, the claw feeding motor 48 is actuated by a fixed amount in the opposite direction from that described above. As a result, the upper and lower claws 45 and 46 return to their original positions, leaving the lead frame 1 on the frame guide rails 2A and 2B.

Thus, lead frames are fed a fixed pitch at a time by repeating the above operation.

When the above-described operations are executed, in the present invention, since the pre-stage heating block 20 and after-stage heating block 21 are provided, via the heating block supporting plates 23A and 23B, to the moving plate 24A to which the frame guide rail 2A is fastened, when the frame guide rail 2A is moved in the Y direction so as to adjust the width or distance between the frame guide rails 2A and 2B, the moving plate 24A is also moved in the Y direction together with the frame guide rail 2A.

In other words, when the frame guide rail 2A is moved in the Y direction, the relative position between the frame guide rail 2A and the pre-stage and after-stage heating blocks 20 and 21 is not changed; instead, there is merely a change in the amount by which the pre-stage and after-stage heating blocks 20 and 21 are moved underneath the frame guide rail 2B.

Accordingly, even if the guide width or distance between the frame guide rails 2A and 2B is changed as a result of a change in the type of product to be processed, there is no need to replace the pre-stage heating block 20 and after-stage heating block 21. Thus, the time required for product change-over work can be shortened, and the operating efficiency of the apparatus can be improved.

Furthermore, in the present invention, the linear guide 40 that extends in the X direction is provided on the moving plate 24A, and the sliders 41 which are fastened to the claw opening-and-closing mechanism 42 are slidable along the linear guide 40. Accordingly, when the moving plate 24A is moved in the Y direction, the claw opening-and-closing mechanism 42 is also moved in the Y direction together with the frame guide rail 2A. In other words, when the frame guide rail 2A is moved in the Y direction, no change occurs in the relative positions between the frame guide rail 2A and the upper and lower claws 45 and 46 in terms of the Y direction. Accordingly, there is no need to adjust the positions of the upper and lower claws 45 and 46 relative to the frame guide rail 2A when the type of product to be processed is changed.

As seen from the above, in the present invention, when the frame guide rail 2A is moved in the Y direction, the pre-stage heating block 20, after-stage heating block 21, upper claw 45 and lower claw 46 are also moved together in the same direction, so that no change occurs in the relative positions of the pre-stage heating block 20, after-stage heating block 21, upper claw 45 and lower claw 46 in the Y direction with respect to the frame guide rail 2A.

Next, the bonding operation will be described.

When the lead frame 1 is conveyed, the bonding stage heating block 3 is in a lowered position.

Then, when a lead frame feeding operation is performed as described above so that the bonding portion of the lead frame 1 is fed to and positioned in the bonding position which is above the bonding stage heating block 3, the heating block raising-and-lowering motor 13 is actuated so that the pulley 11, cam shaft 9 and cam 10 are rotated via the pulley 14 and belt 15. As a result, the roller 7 is raised, and the slider 4 is also raised along the linear guide 6 so that the bonding stage heating block 3 comes into contact with the lead frame 1.

Next, bonding is performed on the bonding portion of the lead frame 1 by, for instance, a die-bonding apparatus or a wire bonding apparatus (not shown).

When bonding is completed, the heating block raising-and-lowering motor 13 is driven in the opposite direction from that described above so that the bonding stage heating block 3 is lowered and separated from the lead frame 1.

Then, a lead frame feeding operation is performed as described above so that the next bonding portion of the lead frame 1 is fed to the bonding position on the bonding stage heating block 3.

Bonding is successively performed by repeating these series of operations.

As seen from the above, according to the present invention, the pre-stage heating block and after-stage heating block are provided so that they can be moved in the direction of width of the lead frames, or in the direction perpendicular to the guide rails, together with one of the frame guide rails and positioned under the other frame guide rail. Accordingly, the time required for product change-over can be shortened, and the operating efficiency of the apparatus can be improved.

What is claimed is:

1. A bonding apparatus comprising a pair of frame guide rails, which are installed so as to face each other and guide a lead frame, a pre-stage heating block, a bonding-stage heating block and an after-stage heating block, which heat said lead frame guided by said frame guide rails, said apparatus being characterized in that said pre-stage heating block and said after-stage heating block are movable together with one of said frame guide rails in a direction of width of said lead frame and provided so as to be positioned under the other said frame guide rail.

2. A bonding apparatus comprising a pair of frame guide rails, which are installed so as to face each other and guide a lead frame; a pre-stage heating block, a bonding-stage heating block and an after-stage heating block, which heat said lead frame guided by said frame guide rails; and feeding claws for intermittently feeding said lead frame, said apparatus being characterized in that said pre-stage heating block, after-stage heating block and feeding claws are movable together with one of said frame guide rails in a direction of width of said lead frames, and said pre-stage heating block and after-stage heating block are provided so as to be positioned under the other said frame guide rail.

3. A bonding apparatus comprising: a pair of frame guide rails which are parallel to each other so as to guide a lead frame thereon, a main heating block for heating said lead frame during bonding, and at least one supplemental heating block for supplementally heating said lead frame, said heating blocks being located between said pair of frame guide rails, wherein said at least one supplemental heating block is movable together with one of said pair of frame guide rails in a direction perpendicular to another of said pair of frame guide rails and a part of said at least one supplemental heating block is located under said another of said pair of frame guide rails.

* * * * *